United States Patent
Park et al.

(10) Patent No.: US 7,199,421 B2
(45) Date of Patent: Apr. 3, 2007

(54) SONOS DEVICE AND METHODS OF MANUFACTURING THE SAME

(75) Inventors: Young-Sam Park, Suwon-si (KR); Seung-Beom Yoon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 198 days.

(21) Appl. No.: 10/948,966

(22) Filed: Sep. 24, 2004

(65) Prior Publication Data

US 2005/0093058 A1  May 5, 2005

(30) Foreign Application Priority Data

Oct. 30, 2003 (KR) .................. 10-2003-0076211

(51) Int. Cl.
  *H01L 29/792* (2006.01)
(52) U.S. Cl. .............. 257/314; 257/324; 438/216; 438/261
(58) Field of Classification Search ............ 257/324, 257/314; 438/216, 261, 591, 593
See application file for complete search history.

(56) References Cited

U.S. PATENT DOCUMENTS

| 5,408,115 A | 4/1995 | Chang ................. 257/324 |
| 5,838,041 A | 11/1998 | Sakagami et al. ........ 257/324 |
| 7,050,330 B2* | 5/2006 | Forbes ................. 365/185.03 |

* cited by examiner

*Primary Examiner*—Douglas W. Owens
(74) *Attorney, Agent, or Firm*—F. Chau & Associates LLC

(57) ABSTRACT

Silicon-oxide-nitride-oxide-silicon (SONOS) devices and methods of manufacturing the same are provided. According to one aspect, a SONOS device includes a semiconductor substrate having a first surface, a second surface of lower elevation than the first surface, and a third surface perpendicular and between the first and second surfaces; a tunnel dielectric layer on the semiconductor substrate; a charge trapping layer in a form of a spacer on the tunnel dielectric layer on the third surface; a charge isolation layer on the tunnel dielectric layer, which covers the charge trapping layer; a gate that extends over a portion of the first surface, over a portion of the second surface, and is adjacent to a portion of the third surface of the semiconductor substrate on the charge isolation layer; a first impurity region formed below the first surface and near the gate; and a second impurity region formed below the second surface, opposite the first impurity region.

17 Claims, 5 Drawing Sheets

SONOS DEVICE AND METHODS OF MANUFACTURING THE SAME

This application claims the priority to Korean Patent Application No. 2003-76211, filed on Oct. 30, 2003, the disclosure of which is incorporated herein by reference in its entirety.

1. Field of the Invention

The present invention relates, generally, to a method of manufacturing a nonvolatile memory semiconductor device, and more particularly, to a silicon-oxide-nitride-oxide-silicon (SONOS) memory semiconductor device having an improved program and erase efficiency, and methods of manufacturing the same.

2. Description of the Related Art

Among nonvolatile semiconductor memory devices, interest is focused on silicon-oxide-nitride-oxide-silicon (SONOS) devices. Unlike conventional stacked gate type nonvolatile memory devices with a floating gate, memory cells of SONOS devices have a charge trapping layer, for example, a silicon nitride layer, instead of the floating gate.

SONOS devices are also known as metal-oxide-nitride-oxide-semiconductor (MONOS) devices. U.S. Pat. No. 6,249,022 issued to Chih-Hung Lin, entitled "Trench flash memory with nitride spacers for electron trapping," issued on Jun. 19, 2001, discloses that SONOS devices are applied in performing two-bit operations. In U.S. Pat. No. 6,249,022, a trench flash memory including two separate nitride spacers disposed below a gate allowing for a two-bit operation is disclosed. Also, a trench is provided, wherein the nitride spacers are formed inside the trench, a channel is formed below the trench, and the gate is formed in the trench.

Figure 1A:
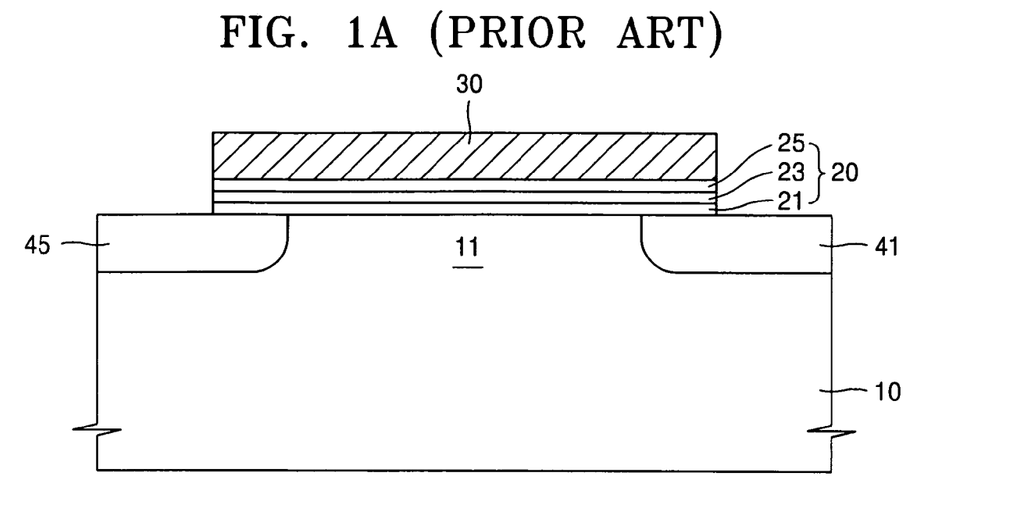
FIGS. 1A and 1B are cross-sectional views illustrating a cell structure of conventional silicon-oxide-nitride-oxide-silicon (SONOS) devices.
Figure 1B:
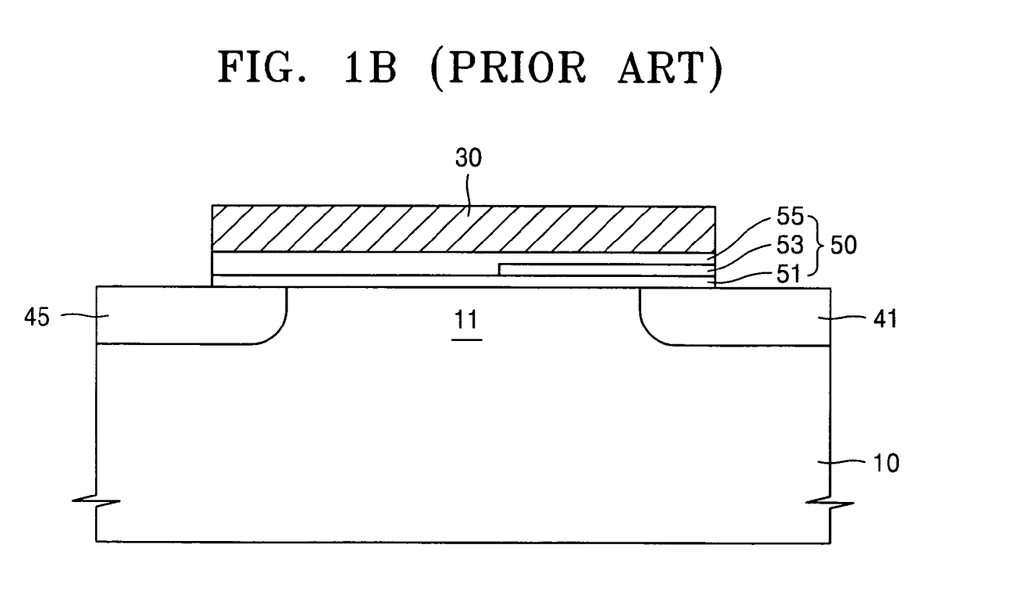

Cell structures of conventional SONOS devices are illustrated in FIGS. 1A and 1B. As illustrated in FIG. 1A, a cell structure of a conventional SONOS device includes an oxide-nitride-oxide (ONO) layer 20 having a first silicon oxide layer 21, a silicon nitride layer 23, and a second silicon oxide layer 25 on a silicon semiconductor substrate 10; a gate 30 disposed on the ONO layer 20; and impurity regions, i.e., a source region 41 and a drain region 45, disposed near the gate 30.

Alternatively, as illustrated in FIG. 1B, a conventional SONOS device can be in a form of a local SONOS device where an ONO layer 50 is disposed near only one impurity region, for example, a source region 41. The ONO layer 50 has a silicon nitride layer 53 and silicon oxide layers 51 and 55 disposed below and above the silicon nitride layer 53.

Conventional SONOS devices as shown in FIGS. 1A and 1B require a relatively high operating voltage. A program operation of a SONOS device is carried out by channel hot electron injection (CHEI). The number of electrons captured by a silicon nitride layer 23 or 53 through CHEI is relatively small compared to the number of electrons that pass through an inversion region of a channel 11 from a drain region 45 to reach a source region 41. In structures such as those in FIGS. 1A and 1B, a high voltage Vpp must be applied to the source region 41 to increase the number of hot electrons during the program operation. An erase operation of a SONOS device may be carried out by channel hot hole injection. For the erase operation, a high voltage Vee is must be applied to the gate 30.

Due to the high voltage, the first silicon oxide layer 21 must be thick. Thus, the electricity used for the operation becomes relatively high because the first silicon oxide layer 21 is thick.

The local SONOS device, as illustrated in FIG. 1B, can prevent to some extent, but not completely solve, the problem of the program and erase operations requiring high voltage. In addition, in the local SONOS device, the silicon nitride layer 53 is locally formed near only the source region 41. Consequently, the potential for misalignment of the ONO layer increases.

In more detail, a photolithographic process accompanies the formation of the local silicon nitride layer 53 and misalignment between a first photolithographic process, which forms the local silicon nitride layer 53, and a second photolithographic process, which forms the gate 30, can occur. As a result, the length of the local silicon nitride layer 53 among the SONOS cells can become irregular, resulting in each SONOS device having a different threshold voltage and erase speed which causes the cells to have different characteristics.

Therefore, a need exists for a SONOS device that increases program and erase efficiency and forms a uniform charge trapping layer among different cells, and methods of manufacturing the same.

SUMMARY OF THE INVENTION

Exemplary embodiments of the present invention provide silicon-oxide-nitride-oxide-silicon (SONOS) devices that can increase program and erase efficiency and form a uniform charge trapping layer among different cells, and methods of manufacturing the same.

According to an exemplary embodiment of the present invention, a SONOS device includes a semiconductor substrate that has a first surface, a second surface of lower elevation than the first surface, and a third surface perpendicular to and between the first and second surfaces; a tunnel dielectric layer on the semiconductor substrate; a charge trapping layer in a form of a spacer on the tunnel dielectric layer on the third surface; a charge isolation layer on the tunnel dielectric layer and which covers the charge trapping layer; a gate that extends over a portion of the first and second surfaces and is adjacent to a portion of the third surface of the substrate on the charge isolation layer; a first impurity region formed below the first surface and near the gate; and a second impurity region formed below the second surface and opposite the first impurity region.

The first impurity region may be formed at a predetermined distance from the third surface and face the charge trapping layer on the third surface. The tunnel dielectric layer may include a silicon oxide layer. The charge trapping layer may include either a silicon nitride layer or an aluminum oxide layer. The charge isolation layer may include a silicon oxide layer. The first impurity region may be a drain region and a second impurity region may be a source region.

According to another exemplary embodiment of the present invention, a SONOS device includes a semiconductor substrate having a trench; a tunnel dielectric layer that extends from a surface of the substrate to a bottom surface and a side surface of the trench; a charge trapping layer in a form of a spacer on the tunnel dielectric layer on the side of the trench; a charge isolation layer on the tunnel dielectric layer and which covers the charge trapping layer; a gate that extends over a portion of the semiconductor substrate surface and over a portion of the bottom of the trench and is adjacent to the side of the trench on the charge isolation layer; a first impurity region formed near the gate and below the surface of the semiconductor substrate; and a second impurity region formed below the bottom of the trench.

The first impurity region is located at a predetermined distance from the side of the trench and is opposite the charge trapping layer on the side of the trench.

According to another exemplary embodiment of the present invention, a method of manufacturing a SONOS device, the method includes forming a semiconductor substrate with a first surface, a second surface of lower elevation than the first surface, and a third surface that forms a side perpendicular to and between the first and second surfaces; forming a tunnel dielectric layer on the semiconductor substrate; forming a charge trapping layer in a form of a spacer on the tunnel dielectric layer on the third surface; forming a charge isolation layer on the tunnel dielectric layer and which covers the charge trapping layer; forming a gate that extends over a portion of the first surface and over a portion of the second surface and is adjacent to a portion of the third surface of the substrate on the charge isolation layer; forming a first impurity region below the first surface and near the gate; and forming a second impurity region below the second surface, opposite the first impurity region.

According to another exemplary embodiment of the present invention, a method of manufacturing a SONOS device includes forming a trench in the semiconductor substrate; forming a tunnel dielectric layer that extends to the side and bottom surfaces of the trench; forming a charge trapping layer in a form of a spacer on the tunnel dielectric layer on the side of the trench; forming a charge isolation layer on the tunnel dielectric layer to cover the charge trapping layer; forming a gate that extends over a portion of the semiconductor substrate surface and over a portion of the bottom of the trench and is adjacent to the side of the trench on the charge isolation layer; forming a first impurity region near the gate and below the surface of the substrate; and forming a second impurity region below the bottom of the trench.

The step of forming the charge trapping layer further includes forming the charge trapping layer by nitrifying the tunnel dielectric layer, and forming the charge trapping layer in a form of a spacer through anisotropic etching.

The step of forming the charge trapping layer further includes forming the charge trapping layer through a chemical vapor deposition on the tunnel dielectric layer, and forming the charge trapping layer in a form of a spacer through anisotropic etching.

According to exemplary embodiments of the present invention, a SONOS device that can increase program and erase efficiency and form a uniform charge trapping layer among different cells and methods of manufacturing the same are provided.

These and other exemplary embodiments, features, aspects, and advantages of the present invention will be described and become more apparent from the following detailed description of the exemplary embodiments when read in conjunction with accompany drawings.

DETAILED DESCRIPTION OF EXEMPLARY EMBODIMENTS

Exemplary embodiments of the invention will now be described more fully with reference to the accompanying drawings.

Exemplary embodiments of the present invention provide a cell structure of a local silicon-oxide-nitride-oxide-silicon (SONOS) device. According to an exemplary embodiment of the present invention, a cell structure of a SONOS device having a charge trapping layer in a form of a spacer is provided. In more detail, the cell structure of the SONOS device includes a first impurity region near a charge trapping layer; a second impurity region, which is either a drain region if the first impurity region is a source region or a source region if the first impurity region is drain region. Further, the charge trapping layer faces the second impurity region and is formed in a shape of a spacer in a trench.

To form the charge trapping layer, a semiconductor substrate has a first surface, a second surface of lower elevation than the first surface, and a third surface that connects the stepped down area between the first and second surfaces and forms a side in the step area. The different surfaces are made by forming a trench in the semiconductor substrate, wherein the bottom of the trench is the second surface, the surface of the semiconductor substrate is the first surface and the side of the trench is the third surface. The charge trapping layer is formed as a spacer on the side of the trench, or the third surface, which is the stepped down area created by the trench.

The basic composing elements of a SONOS device according to the exemplary embodiments of the present invention are a second impurity region formed under the second surface, i.e., the bottom of the trench; a first impurity region formed below the first surface, i.e., the surface of the semiconductor substrate, at a predetermined distance from the side of the trench; and a gate formed to cover the spacer.

During a program operation of the SONOS device with the above-mentioned components, the gate applies voltage to the channel region below the gate and produces an inversion region. When the electrons move through the inversion region from the drain region to the source region, more hot electrons reach the charge trapping layer in the form of a spacer. There is a higher possibility for hot electrons to tunnel through a tunnel dielectric layer because the charge trapping layer in the form of a spacer is formed directly opposite the direction of the electron movement. As such, injection of hot electrons into the charge trapping layer is induced not only because of a vertical electric field produced in the downward direction from the gate but also because of a horizontal electric field produced from the drain region to either the source region or the charge trapping layer. The conventional SONOS devices illustrated in FIGS. 1A and 1B are different in that a vertical electric field dominantly affects hot electron injections.

Hot electron injection efficiency increases because both horizontal and vertical electric fields contribute to hot electron injections. Thus, program efficiency can be increased, which means voltage applied during program operations can be lowered. Consequently, power needed for a program operation is lowered.

Since the horizontal electric field can also have the same effect and assist the hot hole injection during an erase operation, hot hole injection efficiency is increased. As a result, voltage and power needed for erase operations can be lowered.

According to another exemplary embodiment of the present invention, a SONOS device comprises a charge trapping layer in a form of a spacer disposed in a trench, wherein the width of the charge trapping layer can easily be made to be substantially uniform for each cell. Since the width of the spacer depends on the thickness of a layer forming the spacer, the width of the charge trapping layer will be substantially uniform. Also since the height of the spacer depends on the depth of the trench, the depth of the trench must be substantially uniform. Therefore, variation in the characteristics of different SONOS devices can be reduced so that cells can have more uniform characteristics. In other words, unevenness among cells due to misalignment of conventional SONOS devices can be significantly reduced.

FIGS. 2 through 7 are cross-sectional views illustrating a SONOS device and a method of manufacturing the same according to an exemplary embodiment of the present invention.

Figure 2:
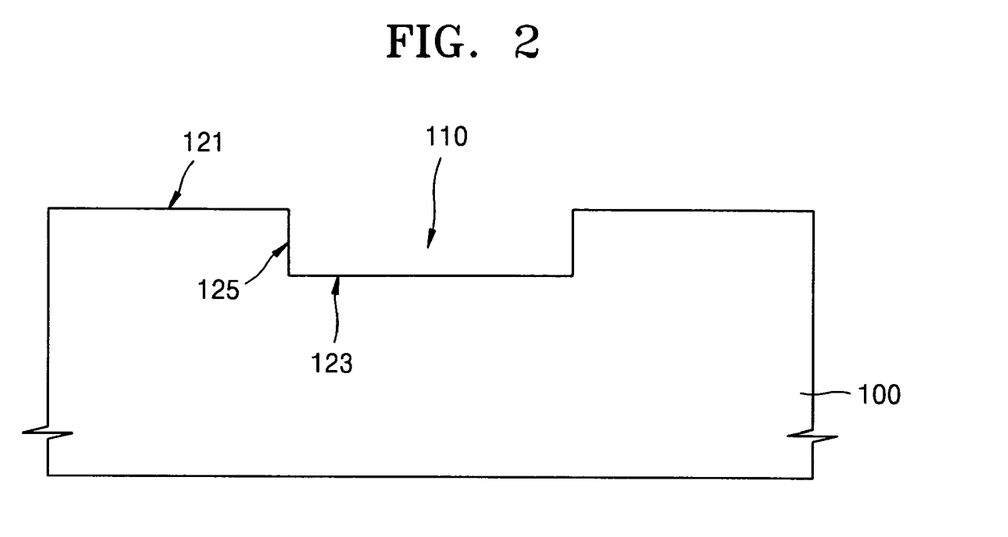
FIGS. 2 through FIG. 7 are cross-sectional views illustrating a SONOS device and a method of manufacturing the same according to an exemplary embodiment of the present invention.

FIG. 2 schematically shows a step of forming a trench 110 in a semiconductor substrate 100 to form a SONOS device according to an exemplary embodiment of the present invention. Referring to FIG. 2, the trench 110 is formed in the semiconductor substrate 100 so that a charge trapping layer 231 (presented in FIGS. 4 through 8) in a shape of a spacer can be formed within the trench 110. The spacer may be formed directly opposite a first impurity region 450 (presented in FIGS. 7 and 8), which is the drain region.

The trench 110 can be formed by selectively performing an anisotropic etch on the semiconductor substrate 100. The formation of the trench 110 results in the formation of several surfaces that can be defined as follows. A first surface 121, which is the surface of the semiconductor substrate; a second surface 123, which is the bottom of the trench 110; and a third surface 125, which is the side of the trench 110. The second surface 123 is slightly stepped down from the first surface 121.

Figure 3:
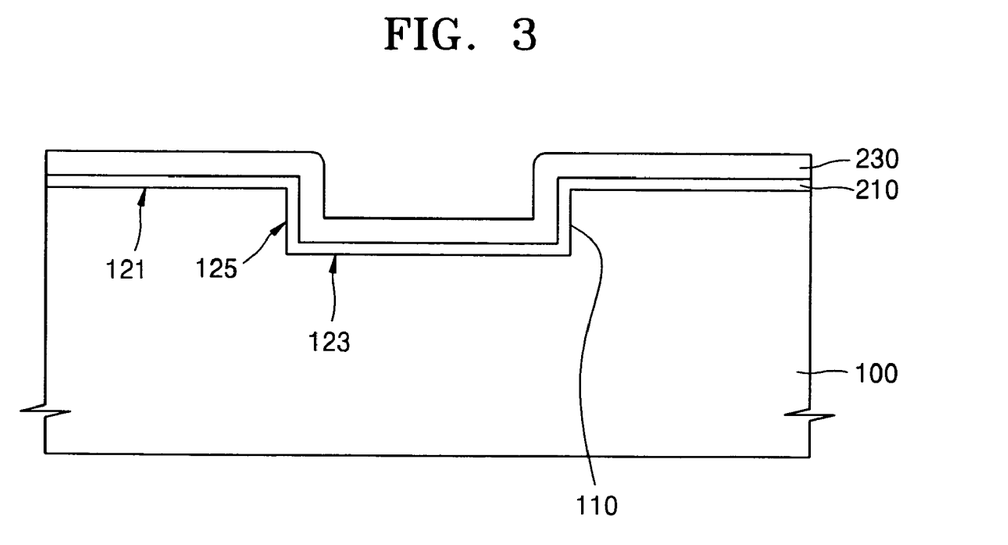

FIG. 3 schematically shows a step of forming a tunnel dielectric layer 210 and a spacer layer 230 from which the charge trapping layer 231 is formed. Referring to FIG. 3, the tunnel dielectric layer 210 is formed on the surface of the semiconductor substrate 100 with the trench 110. The tunnel dielectric layer 210 can be made out of an insulating layer such as a silicon oxide layer. The tunnel dielectric layer 210 can be formed using thermal oxidation or chemical vapor deposition (CVD).

The spacer layer 230, which is used to form the charge trapping layer 231, is formed on the tunnel dielectric layer 210. The spacer layer 230 is a layer that can trap charges, such as a silicon nitride layer, an aluminium oxide ($Al_2O_3$) layer, or an oxide layer comprising trap sites. When the spacer layer 230 is a silicon nitride layer, the silicon nitride layer is formed by a nitridation or a CVD process. The thickness of the spacer layer 230 defines the width of the charge trapping layer 231 to be formed in a subsequent step. Therefore, the width of the spacer layer 230 is determined considering the desired width of the charge trapping layer 231.

Figure 4:
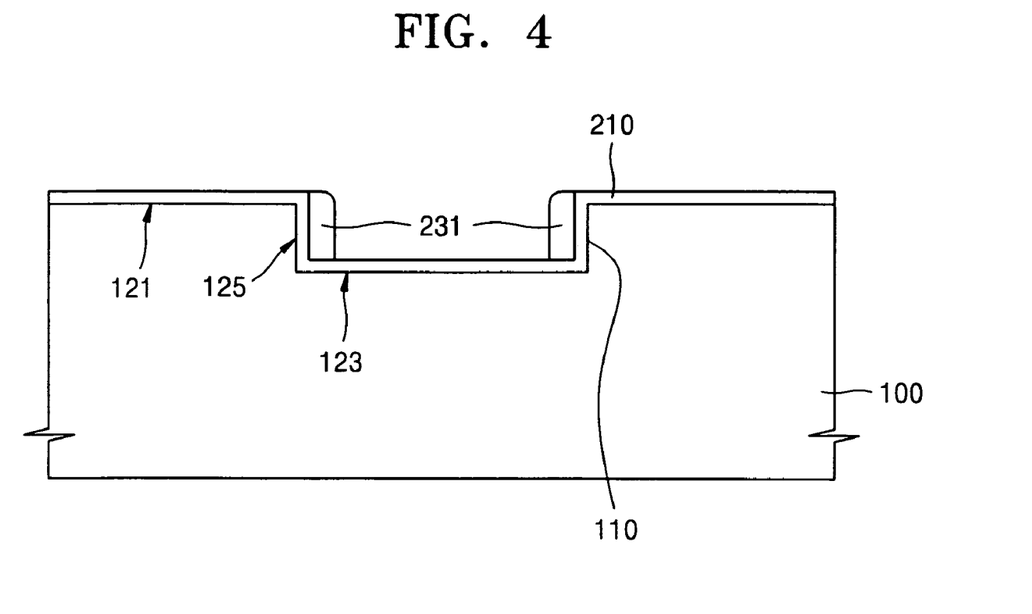

FIG. 4 schematically shows a step of forming the charge trapping layer 231 in a form of a spacer by etching the spacer layer 230. Referring to FIG. 4, the charge trapping layer 231 is formed out of the spacer layer 230 by, for example, anisotropic dry etching the spacer layer 230. In other words, anisotropically etching the spacer layer 230 forms the charge trapping layer 231 on the side of the trench 110, that is, the third surface. Since the width of the charge trapping layer 231 depends on the width of the spacer layer 230, even a charge trapping layer having a very narrow width can be created. The formation of a charge trapping layer having a very narrow width makes it possible for the entire SONOS device to be scaled down in size.

Figure 5:
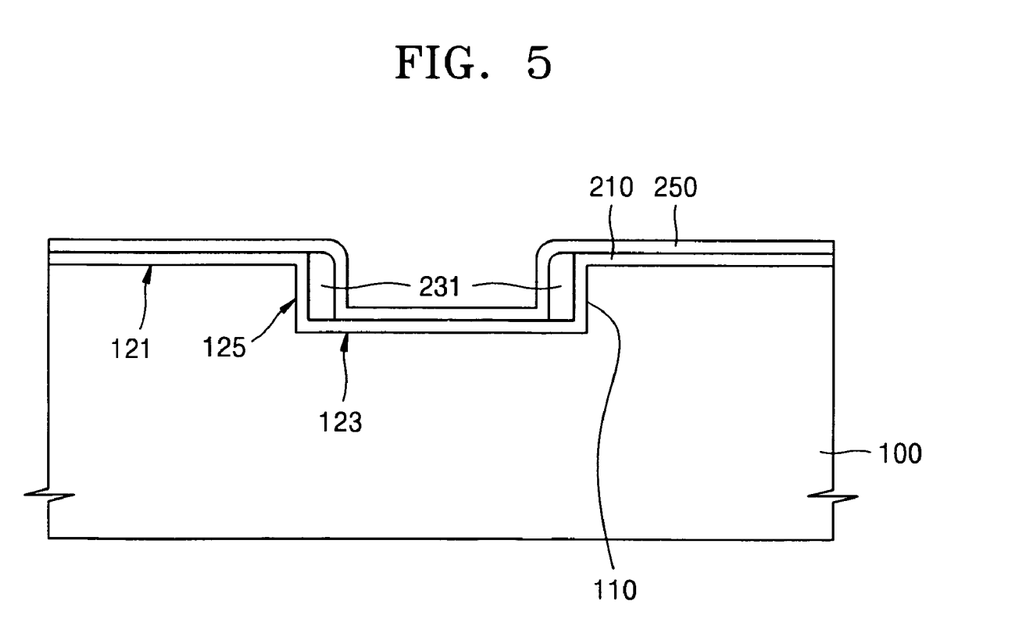

FIG. 5 schematically shows a step of forming a charge isolation layer 250 on the charge trapping layer 231 and the dielectric layer 210. Referring to FIG. 5, the charge isolation layer 250 on the tunnel dielectric layer 210 and covering the charge trapping layer 231 is composed of, for example, insulating materials. The charge isolation layer 250 is typically a silicon oxide layer. The thermal oxidation or a CVD process can be used to form the charge isolation layer 250. The charge isolation layer 250 can also be a silicon nitride layer or a bilayer composed of silicon oxide layers.

As a result of the foregoing steps, an oxide-nitride-oxide (ONO) stack 200 is formed.

Figure 6:
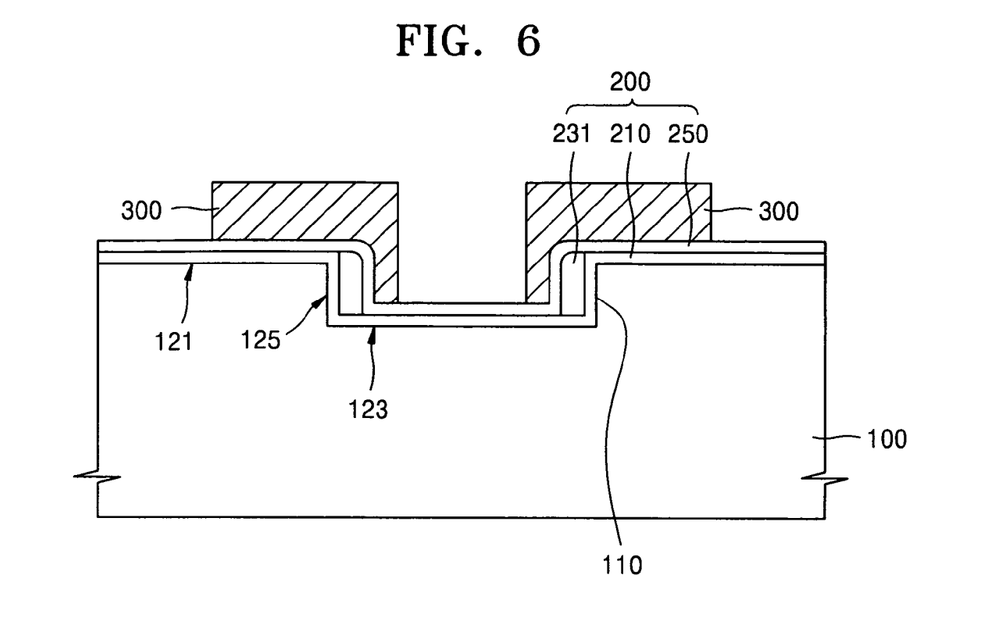

FIG. 6 schematically shows a step of forming a gate 300 on the charge isolation layer 250. Referring to FIG. 6, a conductive layer, that is, a conductive polycrystalline silicon layer, is formed on the ONO stack 200 and a patterning process, for example, a photographic etching process, is used to form the gate 300. The gate 300 is formed over a portion of the first surface 121 of the semiconductor substrate 100, over a portion of the second surface 123 at the bottom of the trench 110, and adjacent to a portion of the third surface 125 at the side of the trench 110. In other words, only a portion of the trench 110 is filled by the gate 300, thereby leaving a portion of the trench 110 unfilled, and a portion of the charge isolation layer 250 exposed along the bottom of the trench 110.

In the patterning process used to form the gate 300, the exposed portion of the charge isolation layer 250, i.e., the portion not covered by the gate 300, and the tunnel dielectric layer 210 below the exposed charge isolation layer may be etched and removed. However, depending on the circumstances, the exposed charge isolation layer and the tunnel dielectric layer below the exposed charge isolation layer may remain, as illustrated in FIG. 6.

Figure 7:
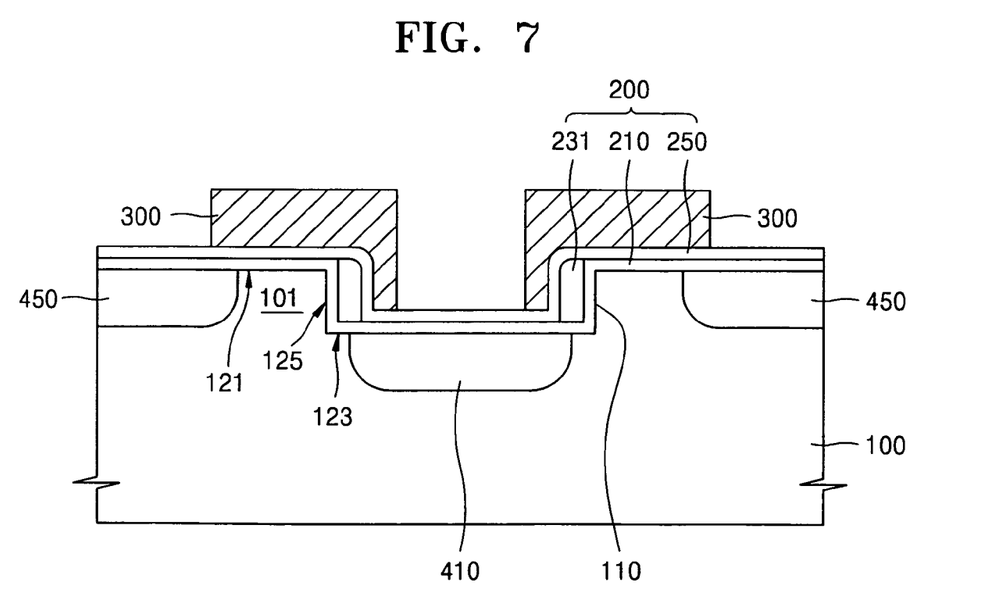

FIG. 7 schematically shows a step of forming the first impurity region 450 and a second impurity region 410, for example, a drain region and a source region, respectively, near the gate 300. Referring to FIG. 7, the first and second impurity regions 450 and 410 are formed by implanting portions of the semiconductor substrate 100 not covered by the gate 300 with impurities through an ion implantation process. The ion implantation process that forms the first impurity region 450 and the second impurity region 410 can be performed simultaneously or successively to create the first impurity region 450 and the second impurity region 410. The junction structure can be a single drain, a lightly doped drain (LDD), a double-doped drain (DDD) or a pocket lightly doped drain (PLDD).

After the ion implantation process, a polycide process or a salicide process to form a tungsten silicide ($Wsi_x$) layer, a cobalt silicide ($CoSi_x$) layer or a titanium silicide ($TiSi_x$) layer can be performed.

When forming a SONOS device according to the present invention through the above-mentioned processes, the total number of masks is not increased compared to the number of masks used when forming conventional SONOS devices, as illustrated in FIGS. 1A and 1B.

Again referring to FIG. 7, a SONOS device according to an exemplary embodiment of the present invention may have a first impurity region 450, for example, a drain region, formed near the gate 300 and below the first surface 121, which is the original surface of the semiconductor substrate 100, and may have a second impurity region 410, for example, a source region, formed below the bottom of the trench 110 that has lower elevation than the first surface 121. A channel region 101 is formed in the semiconductor substrate 100 between the first impurity region 450 and the second impurity region 410 below the gate 300. The second impurity region 410 is located away from the third surface 125 at the side of the trench 110, so that the channel region 101 can further extend to below the second surface 123.

Figure 8:
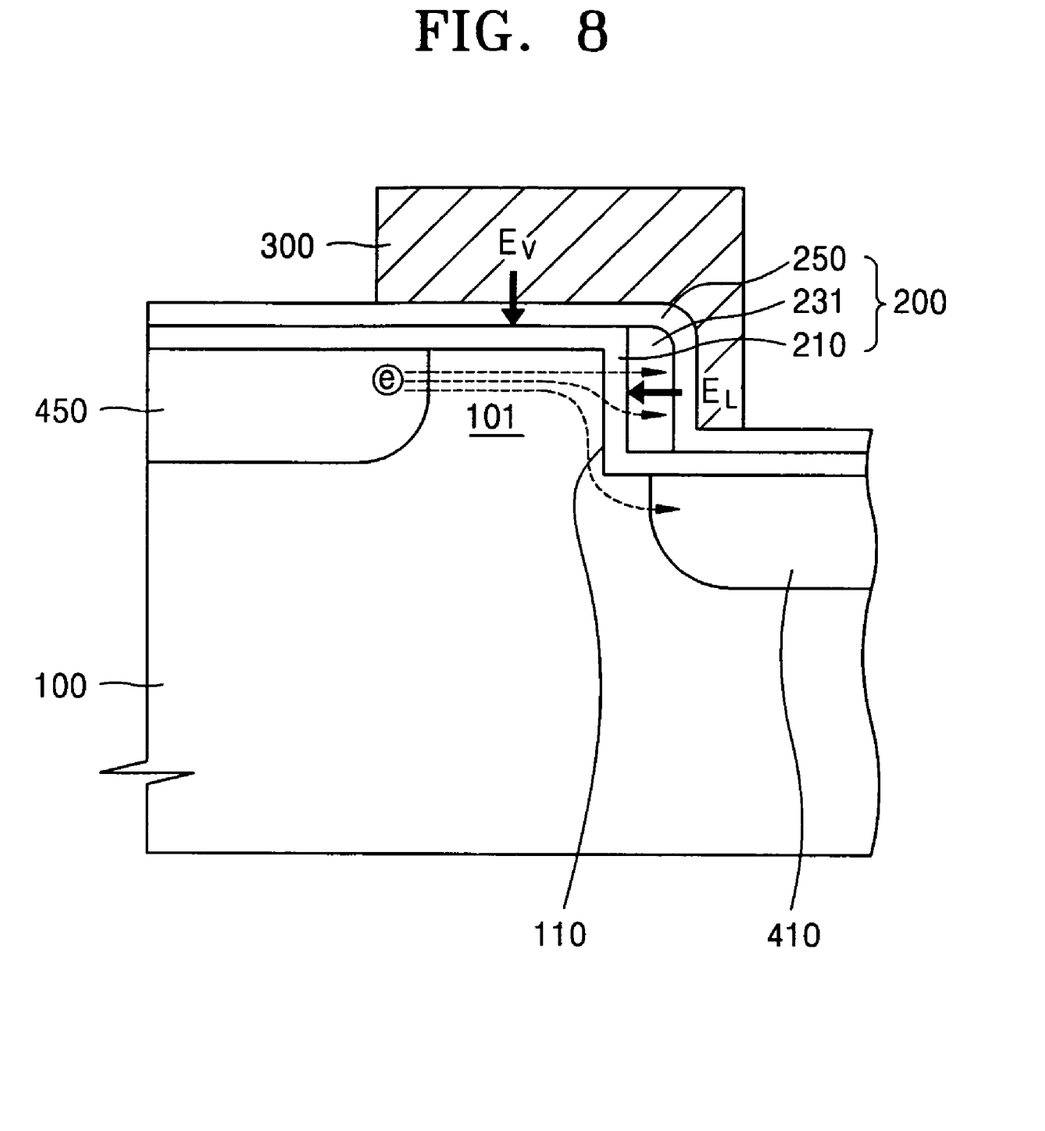
FIG. 8 is a cross-sectional view illustrating program and erase operations of a SONOS device according to another exemplary embodiment of the present invention.

The present invention with above-mentioned structure improves the efficiency of the program and erase operations of a SONOS device. FIG. 8 shows a program operation according to another exemplary embodiment of the present invention.

FIG. 8 is a cross-sectional view illustrating program and erase operations of a SONOS device according to another exemplary embodiment of the present invention. Referring to FIG. 8, when a program voltage (Vpp) is applied to the second impurity region 410, which is the source region, and the gate 300 is positively charged, a program operation is performed. Here, the first impurity region 450, which is the drain region, can be grounded. Due to the positively charged gate 300, an inversion region is produced at the channel region 101 between the second impurity region 410 and the first impurity region 450. Electrons flow from the first impurity region 450, for example, the drain region, to the second impurity region 410, for example, the source region, through the inversion region. There are also hot electrons flowing among the electrons. Due to a vertical electric field $E_v$, which is produced in a downward direction from the gate 300, and a horizontal electric field $E_L$, which is produced from the drain region to either the source region or the charge trapping layer 231, the hot electrons that permeate the tunnel dielectric layer 210 are trapped in the charge trapping layer 231.

The charge trapping layer 231 is at a right angle to the flow of the electrons because of the trench 110. Therefore, the horizontal electric field $E_L$, as well as the vertical electric field $E_v$, helps and leads the injected hot electrons through the tunnel dielectric 210 into the charge trapping layer 231. The flow of the electrons can be as illustrated in FIG. 8 with dotted arrows. Since the charge trapping layer 231 is at a right angle to the flow of the electrons, there is a higher possibility that the horizontal electric field $E_L$ will draw and tunnel more hot electrons. Thus, the total amount of hot electrons injected into the charge trapping layer 231 will be very high.

As a result, injection efficiency of the hot electrons injected into the charge trapping layer 231 is greatly increased during a program operation. This means that a program voltage (Vpp) applied during a program operation can be lowered. Hence, there is no need, for example, for the tunnel dielectric layer 210 to be thick. In other words, since the tunnel dielectric layer 210 can be formed very thin, power can be saved.

Also during an erase operation, both the vertical electric field $E_v$, and the horizontal electric field $E_L$ can affect hot holes. Since, hot holes are drawn by the horizontal electric field $E_L$, the hot holes are more efficiently injected into the charge trapping layer 231. Consequently, a voltage (Vee) applied to the gate 300 for the erase operation can be lowered, which reduces power usage.

As described above, the present invention provides a structure of a local SONOS device having decreasing cell area and greatly reduced ONO misalignment. As the SONOS device of the present invention has a charge trapping layer at a side of a trench, the injection efficiency of hot electrons and hot holes injected into the charge trapping layer can be greatly increased. Therefore, a very high program and erase operation efficiency can be achieved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A silicon-oxide-nitride-oxide-silicon (SONOS) device, comprising:
    a semiconductor substrate including a first surface, a second surface of lower elevation than the first surface, and a third surface perpendicular to and between the first and second surfaces;
    a tunnel dielectric layer disposed on the semiconductor substrate;
    a charge trapping layer in a form of a spacer disposed on the tunnel dielectric layer on the third surface;
    a charge isolation layer disposed on the tunnel dielectric layer and which covers the charge trapping layer;
    a gate that extends over a portion of the first surface and over a portion of the second surface and is adjacent to a portion of the third surface of the substrate on the charge isolation layer;
    a first impurity region formed below the first surface and near the gate, wherein the first impurity region is disposed at a distance away from the third surface and facing the charge trapping layer on the third surface;
    a second impurity region formed below the second surface, opposite the first impurity region; and
    a channel region in the semiconductor substrate between the first and second impurity regions, wherein a portion of the channel region extends along a portion of the first surface of the semiconductor substrate between the first impurity region and the third surface of the semiconductor substrate.

2. The SONOS device of claim 1, wherein the tunnel dielectric layer comprises a silicon oxide layer.

3. The SONOS device of claim 1, wherein the charge trapping layer comprises one of a silicon nitride layer and an aluminum oxide layer.

4. The SONOS device of claim 1, wherein the charge isolation layer comprises a silicon oxide layer.

5. The SONOS device of claim 1, wherein the first impurity region is a drain region and a second impurity region is a source region.

6. A SONOS device comprising:
    a semiconductor substrate including a trench;
    a tunnel dielectric layer that extends from a surface of the substrate to a bottom surface and a side surface of the trench;
    a charge trapping layer in a form of a spacer disposed on the tunnel dielectric layer on the side surface of the trench;
    a charge isolation layer disposed on the tunnel dielectric layer and which covers the charge trapping layer;
    a gate that extends over a portion of the semiconductor surface and over a portion of the bottom surface of the trench and is adjacent to a portion of the side surface of the trench on the charge isolation layer;
    a first impurity region formed near the gate and below the surface of the semiconductor substrate, wherein the first impurity region is disposed at a distance away from the side surface of the trench;

a second impurity region formed below the bottom surface of the trench, wherein the second impurity region is disposed at a distance away from the side surface of the trench; and a channel region between the first and second impurity regions, wherein a portion of the channel region extends along a portion of the surface of the substrate between the first impurity region and the side surface of the trench and wherein a portion of the channel region extends alone a portion of the bottom surface of the trench between the second impurity region and the side surface of the trench.

7. The SONOS device of claim 6, wherein the first impurity region is a drain region and a second impurity region is a source region.

8. A method of manufacturing a SONOS device, the method comprising:

forming a semiconductor substrate including a first surface, a second surface of lower elevation than the first surface, and a third surface perpendicular to and between the first and second surfaces;

forming a tunnel dielectric layer on the semiconductor substrate;

forming a charge trapping layer in a form of a spacer on the tunnel dielectric layer on the third surface;

forming a charge isolation layer on the tunnel dielectric layer to cover the charge trapping layer;

forming a gate that extends over a portion of the first surface and over a portion of the second surface and is adjacent to a portion of the third surface of the substrate on the charge isolation layer;

forming a first impurity region below the first surface and near the gate, wherein the first impurity region is disposed at a distance away from the third surface and facing the charge trapping layer to thereby provide a channel region having a portion that extends along the first surface of the semiconductor substrate between the first impurity region and the third surface of the semiconductor substrate; and forming a second impurity region below the second surface, opposite the first impurity region.

9. A method of manufacturing a SONOS device, the method comprising:

forming a trench in the semiconductor substrate;

forming a tunnel dielectric layer that extends from a surface of the substrate to a side surface and a bottom surface of the trench;

forming a charge trapping layer in a form of a spacer on the tunnel dielectric layer on the side surface of the trench;

forming a charge isolation layer on the tunnel dielectric layer to cover the charge trapping layer;

forming a gate that extends over a portion of the semiconductor substrate surface and over a portion of the bottom surface of the trench and is adjacent to a portion of the side surface of the trench on the charge isolation layer;

forming a first impurity region near the gate and below the surface of the semiconductor substrate, wherein the first impurity region is disposed at a distance away from the side surface of the trench;

forming a second impurity region below the bottom surface of the trench, wherein the second impurity region is disposed at a distance away from the side surface of the trench; and providing a channel region between the first and second impurity regions, wherein a portion of the channel region extends along a portion of the surface of the substrate between the first impurity region and the side surface of the trench and wherein a portion of the channel region extends along a portion of the bottom surface of the trench between the second impurity region and the side surface of the trench.

10. The method of manufacturing a SONOS device, wherein forming the charge trapping layer of claim 9 further comprises:

forming the charge trapping layer by nitrifying the tunnel dielectric layer; and forming the charge trapping layer in a form of a spacer through anisotropic etching.

11. The method of manufacturing a SONGS device, wherein forming the charge trapping layer of claim 9 further comprises:

forming the charge trapping layer on the tunnel dielectric layer using a chemical vapor deposition; and forming the charge trapping layer in a form of a spacer through anisotropic etching.

12. A silicon-oxide-nitride-oxide-silicon (SONOS) device, comprising:

a semiconductor substrate including a trench formed in a surface of the substrate, the trench comprising a bottom surface and a sidewall surface extending between the substrate surface and the bottom surface of the trench;

a tunnel dielectric layer disposed on portions of the substrate surface and the sidewall and bottom surfaces of the trench;

a charge trapping layer in a form of a spacer disposed on a portion of the tunnel dielectric layer adjacent to the sidewall surface of the trench;

a charge isolation layer which is disposed on portions of the tunnel dielectric layer and charge trapping layer disposed on the substrate surface and the bottom surface of the trench and which is disposed on the charge trapping layer adjacent to the sidewall surface of the trench; and a gate which is disposed over portions of the charge isolation layer disposed on the substrate surface and bottom surface of the trench, and wherein the gate is disposed adjacent to portions of a channel region extending along the substrate surface to the sidewall surface of the trench and extending along the sidewall surface of the trench between the substrate surface and bottom surface of the trench.

13. The silicon-oxide-nitride-oxide-silicon (SONOS) device of claim 12, further comprising:

a first impurity region formed below the substrate surface and disposed at a distance from the sidewall surface of the trench, wherein a portion of the first impurity region is disposed below the portion of the gate disposed on the substrate surface; and a second impurity region formed below the bottom surface of the trench.

14. The SONOS device of claim 12, wherein the tunnel dielectric layer is a silicon oxide layer.

15. The SONOS device of claim 12, wherein the charge trapping layer is a silicon nitride layer, an aluminum oxide layer, or an oxide layer comprising trap sites.

16. The SONOS device of claim 12, wherein the charge isolation layer is a silicon oxide layer or a bilayer composed of silicon oxide layers.

17. The SONOS device of claim 12, wherein the first impurity region is a drain region and a second impurity region is a source region.

* * * * *